(12) United States Patent
Jang

(10) Patent No.: US 7,542,358 B2
(45) Date of Patent: Jun. 2, 2009

(54) DLL WITH REDUCED SIZE AND SEMICONDUCTOR MEMORY DEVICE INCLUDING DLL AND LOCKING OPERATION METHOD OF THE SAME

(75) Inventor: Eun Jung Jang, Seoul (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 266 days.

(21) Appl. No.: 11/528,563

(22) Filed: Sep. 28, 2006

(65) Prior Publication Data

US 2007/0263460 A1 Nov. 15, 2007

(30) Foreign Application Priority Data

May 15, 2006 (KR) ...................... 10-2006-0043322

(51) Int. Cl.
*G11C 17/00* (2006.01)
(52) U.S. Cl. .................. 365/194; 365/191; 365/193; 365/201
(58) Field of Classification Search .............. 365/194, 365/193, 201, 191
See application file for complete search history.

(56) References Cited

U.S. PATENT DOCUMENTS 5,956,290 A * 9/1999 Matsuzaki ............... 365/233.1
6,765,976 B1  7/2004 Oh
7,212,465 B2 * 5/2007 Kang ....................... 365/193

FOREIGN PATENT DOCUMENTS

| KR | 1020010091534 | 10/2001 |
|----|---------------|---------|
| KR | 1020040064862 | 7/2004  |
| KR | 1020040095981 | 11/2004 |
| KR | 1020060079581 | 7/2006  |

OTHER PUBLICATIONS

Notice of Allowance for Korean App. 2006-43322.

* cited by examiner

*Primary Examiner*—Pho M. Luu
(74) *Attorney, Agent, or Firm*—Lowe Hauptman Ham & Berner, LLP

(57) ABSTRACT

A delay locked loop(DLL) includes a phase detector for detecting phase difference between input clock signals and feedback clock signals, and outputting phase detection signals according to results of the detection, a delay line for delaying the input clock signals in response to first and second delay control signals, and outputting delay clock signals, a delay controller for generating the first and the second delay control signals in response to the phase detection signals, and a delay model for delaying reference clock signals during predetermined time, and outputting the delayed signals as the feedback clock signals.

42 Claims, 10 Drawing Sheets

DLL WITH REDUCED SIZE AND SEMICONDUCTOR MEMORY DEVICE INCLUDING DLL AND LOCKING OPERATION METHOD OF THE SAME

BACKGROUND

1. Field of the Invention

The present invention relates to a semiconductor device, and more particularly, to a Delay Locked Loop (hereinafter, referred to as DLL) for generating internal clock signals, a semiconductor memory device including the DLL and a locking operation method of the same.

2. Discussion of Related Art

Generally, a DLL corresponds to a semiconductor device for generating internal clock signals based on external clock signals in order to compensate for skew between the external clock signals and the internal clock signals, or between the external clock signals and output data. Accordingly, a synchronous semiconductor memory device for inputting or outputting data in synchronization with external clock signals includes a DLL as an internal clock generator. FIG. 1 schematically shows a conventional DLL and semiconductor memory device. Referring to FIG. 1, the DLL 10 includes an input buffer 11, a phase detector 12, a delay controller 13, a delay line 14, an output buffer 15 and a replica delay 16. The DLL 10 generates internal clock signals INCLK based on external clock signals EXCLK. Since a detailed operation of the DLL 10 can be easily understood by those skilled in the art, details will be omitted for convenience of a description. In the semiconductor memory device including the DLL 10, an output enable controller 20 receives the internal clock signals INCLK, and generates internal strobe signals DQSCLK based on the internal clock signals INCLK in response to output enable signals OUTEN. Further, a data output controller 30 receives the internal clock signals INCLK, and outputs output control signals DQCLK based on the internal clock signals INCLK in response to the output enable signals OUTEN. A Data Queue Strobe (hereinafter, referred to as DQS) driver 40 outputs data strobe signals DQS to an external device (not shown) in response to the internal strobe signals DQSCLK. Data output drivers 50 receive internal data signals INLDA1 to INLDAK (K is an integer), respectively, and outputs output data signals DQ1 to DQK to the external device in response to the output control signals DQCLK. As a result, the semiconductor memory device outputs the data strobe signals DQS and the output data signals DQ1 to DQK to the external device in synchronization with the external clock signals EXCLK. Accordingly, the external device receives the output data signals DQ1 to DQK in synchronization with the data strobe signals DQS. In the meantime, the replica delay 16 is designed to have delay time equal to time required until clock signals DLCLK outputted from the delay line 14 pass through the output buffer 15, the output enable controller 20 and the DQS driver 40, and are finally outputted as the data strobe signals DQS. Accordingly, the replica delay 16 delays the clock signals DLCLK during the same delay time as that due to the output path of the clock signals DLCLK, and outputs the delay signals as feedback clock signals FBCLK. The DLL 10 compares the phase of the feedback clock signals FBCLK with the phase of the external clock signals EXCLK, and generates the internal clock signals INCLK so that the data strobe signals DQS synchronizes with the external clock signals EXCLK, according to the comparison results. However, both the time (i.e. the delay time of the output enable controller 20) required when the internal clock signals INCLK pass through the output enable controller 20, and the delay time of the replica delay 16 may change according to conditions in manufacturing processes of the semiconductor memory device. When the delay time of the output enable controller 20 changes, the delay time of the replica delay 16 may differ from delay time due to an actual output path of the clock signals DLCLK. Specifically, the delay time of the replica delay 16 may be greater or less than delay time due to the output buffer 15, the output enable controller 20 and the DQS driver 40. As described above, when the delay time of the replica delay 16 does not coincide with the delay time due to the actual output path of the clock signals DLCLK, skew between the data strobe signals DQS/the output data signals DQ1 to DQK and the external clock signals may increase. Further, in the previously manufactured semiconductor memory device, it is very difficult to compensate for the skew increased due to difference between the delay time due to the actual output path of the clock signals DLCLK and the delay time of the replica delay 16. Furthermore, since the replica delay 16 must be designed to have the same delay time as that due to the actual output path of the clock signals DLCLK, the occupation area of the replica delay 16 increases. Therefore, the size of the DLL 10 may increase.

SUMMARY OF THE INVENTION

Accordingly, it is an object of the present invention to provide a DLL which can not only reduce skew between data strobe signals/output data signals and external clock signals, which may occur according to conditions in manufacturing processes, by generating feedback clock signals based on reference clock signals received from a controller that exists in an actual output path of internal clock signals, but can also have a reduced size.

It is another object of the present invention to provide a semiconductor memory device including a DLL which can not only reduce skew between data strobe signals/output data signals and external clock signals, which may occur according to conditions in manufacturing processes, by generating feedback clock signals based on reference clock signals received from a controller that exists in an actual output path of internal clock signals, but can also have a reduced size.

It is further another object of the present invention to provide a locking operation method of a DLL which can not only reduce skew between data strobe signals/output data signals and external clock signals, which may occur according to conditions in manufacturing processes, by generating feedback clock signals based on reference clock signals received from a controller that exists in an actual output path of internal clock signals, but can also have a reduced size.

According to one aspect of the present invention, there is provided a Delay Locked Loop (DLL) comprising: a phase detector for detecting phase difference between input clock signals and feedback clock signals, and outputting phase detection signals according to results of the detection; a delay line for delaying the input clock signals in response to first and second delay control signals, and outputting delay clock signals; a delay controller for generating the first and the second delay control signals in response to the phase detection signals; and a delay model for delaying reference clock signals during predetermined time, and outputting the delayed signals as the feedback clock signals, wherein the reference clock signals are generated by one of circuits that exist in an actual output path of the delay clock signals.

According to further aspect of the present invention, there is provided a semiconductor memory device comprising: a Delay Locked Loop (DLL) for generating internal clock signals based on external clock signals and reference clock signals; an output enable controller for outputting internal strobe signals and the reference clock signals in response to the internal clock signals and output enable signals; and a Data Queue Strobe (DQS) driver for outputting data strobe signals to external devices in response to the internal strobe signals.

According to still aspect of the present invention, there is provided a semiconductor memory device comprising: a Delay Locked Loop (DLL) for generating internal clock signals based on external clock signals and reference clock signals; an output enable controller for outputting internal strobe signals and the reference clock signals in response to the internal clock signals and output enable signals; an output controller for outputting output control signals in response to internal clock signals and output enable signals; a Data Queue Strobe (DQS) driver for outputting data strobe signals to external devices in response to the internal strobe signals; and multiple data input/output drivers for, in a read operation of the semiconductor memory device, outputting internal output data signals, which are received from an internal core circuit through an internal input/output circuit of the semiconductor memory device, to the external devices, respectively, as output data signals in response to output control signals generated based on the internal clock signals, wherein the output enable controller or the output controller further generates reference clock signals in response to internal clock signals.

According to yet aspect of the present invention, there is provided a locking operation method of a Delay Locked Loop (DLL), the method comprising the steps of: receiving external clock signals and outputting input clock signals; generating reference clock signals through one of external circuits that exist in an actual output path of internal clock signals; delaying the reference clock signals during predetermined time, and outputting the delayed signals as feedback clock signals; detecting phase difference between the input clock signals and the feedback clock signals, and outputting phase detection signals according to results of the detection; generating first and second delay control signals in response to the phase detection signals; delaying the input clock signals in response to the first and the second delay control signals, and outputting delay clock signals; and outputting the internal clock signals in response to the delay clock signals.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF PREFERRED EMBODIMENTS

Hereinafter, embodiments of the present invention will be described with reference to the accompanying drawings.

Figure 1:
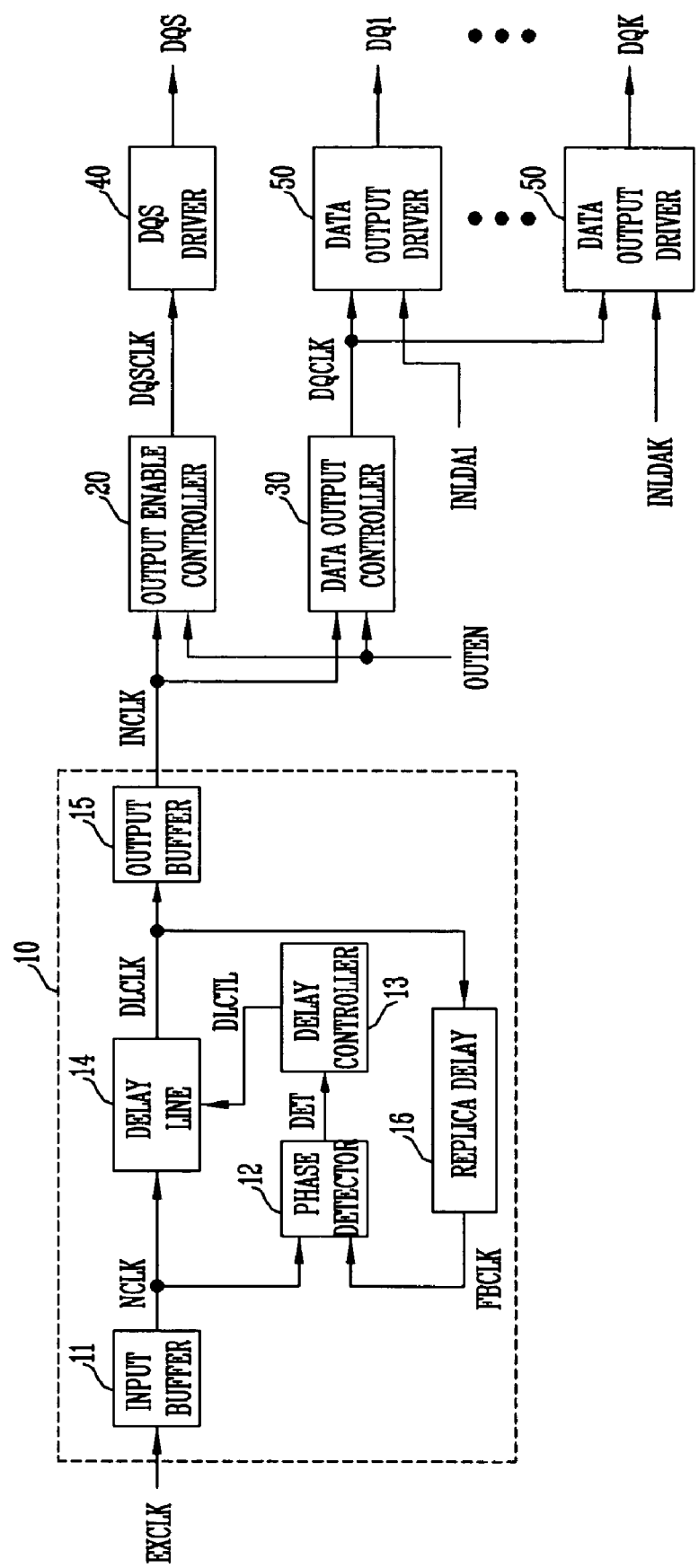
FIG. 1 schematically shows a conventional DLL and semiconductor memory device.
Figure 2:
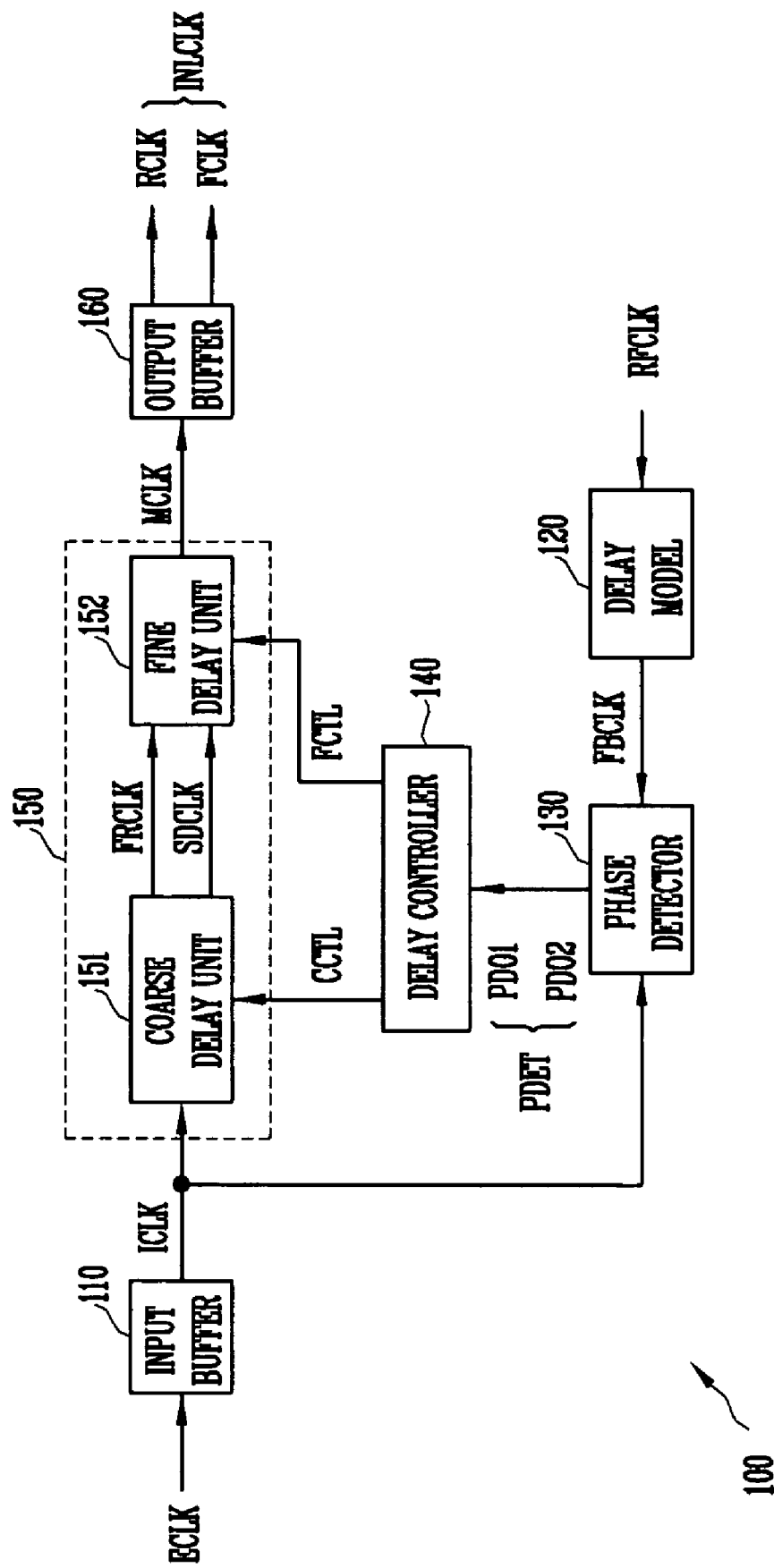
FIG. 2 shows a DLL in accordance with an exemplary embodiment of the present invention.

FIG. 2 shows a DLL in accordance with an exemplary embodiment of the present invention. Referring to FIG. 2, the DLL 100 includes an input buffer 110, a delay model 120, a phase detector 130, a delay controller 140, a delay line 150 and an output buffer 160. The input buffer 110 receives external clock signals EXCLK, and outputs the external clock signals EXCLK as input clock signals ICLK. The delay model 120 delays reference clock signals RECLK during predetermined time, and outputs the delayed signals as feedback clock signals FBCLK. Preferably, the predetermined time may be set to be equal to the delay time of one (e.g. a DQS driver 207, see FIG. 7) of circuits that exist in an actual output path of internal clock signals INL generated by the DLL 100.

The phase detector 130 detects phase difference between the input clock signals ICLK and the feedback clock signals FBCLK, and outputs phase detection signals PDET according to the detection results. The phase detection signals PDET include first and second detection signals PD01 and PD02. The delay controller 140 outputs delay control signals CCTL and FCTL in response to the phase detection signals PDET. The delay line 150 delays the input clock signals ICLK in response to the delay control signals CCTL and FCTL, and outputs delay clock signals MCLK. Specifically, the delay line 150 includes a coarse delay unit 151 and a fine delay unit 152. The coarse delay unit 151 adjusts coarse delay time in response to the delay control signals CCTL, delays the input clock signals ICLK during the adjusted coarse delay time, and outputs coarse delay clock signals FRCLK and SDCLK. Hereinafter, an operation of the coarse delay unit 151 will be described in more detail with reference to FIG. 5. The coarse delay unit 151 alternatively shifts the rising edges of the coarse delay clock signals FRCLK and SDCLK by unit coarse delay time DF1 whenever the delay control signals CCTL are received. For example, it may be considered that the coarse delay unit 151 outputs the coarse delay clock signals FRCLK and SDCLK expressed by FD1 and SD2, respectively. In such a case, if the delay controller 140 outputs the delay control signals CCTL for increasing the coarse delay time, the coarse delay unit 151 outputs the coarse delay clock signals FRCLK expressed by FD2. That is, the coarse delay unit 151 shifts the rising edge of the coarse delay clock signals FRCLK from FD1 to FD2 by the unit coarse delay time DF1. For example, in a case in which the coarse delay unit 151 outputs the coarse delay clock signals FRCLK and SDCLK expressed by FD1 and SD1, respectively, whenever the delay control signals CCTL for increasing the coarse delay time are received, the coarse delay unit 151 alternatively shifts the rising edges of the coarse delay clock signals FRCLK and SDCLK in a sequence of FD2→SD2→FD3→SD3.

Figure 5:
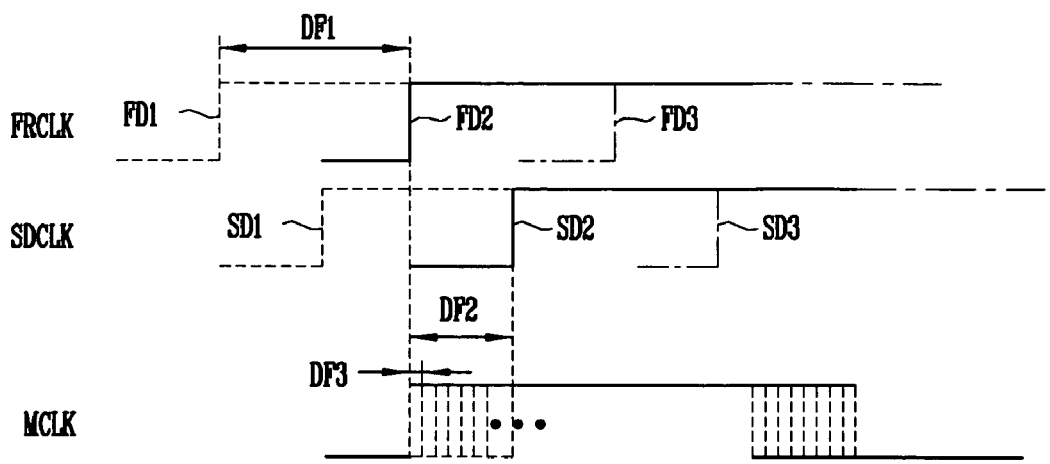
FIG. 5 shows timing of signals relating to the operation of the coarse delay unit in FIG. 2 in accordance with an exemplary embodiment of the present invention.

Referring to FIG. 2, the fine delay unit 152 mixes the coarse delay clock signals FRCLK and SDCLK in response to the delay control signals FCTL, thereby generating multiple mixed signals having different phases, which exist between the coarse delay clock signals FRCLK and SDCLK. Referring to FIG. 5, when the coarse delay unit 151 outputs the coarse delay clock signals FRCLK and SDCLK expressed by FD2 and SD2, respectively, the multiple mixed signals having different phases, which exist between the coarse delay clock signals FRCLK and SDCLK, i.e. an interval DF2, are drawn by dotted lines. Phase difference DF3 exists between two adjacent mixed signals from among the multiple mixed signals. The fine delay unit 152 selects one of the multiple mixed signals, and outputs the selected signals as the delay clock signals MCLK. The output buffer 160 outputs internal clock signals INLCLK in response to the delay clock signals MCLK. Preferably, the internal clock signals INLCLK include first and second clock signals RCLK and FCLK, which are complementary to each other. Herein, the output buffer 160 may further output the reference clock signals RECLK in response to the delay clock signals MCLK. In such a case, the predetermined delay time of the delay model 120 must increase.

Figure 3:
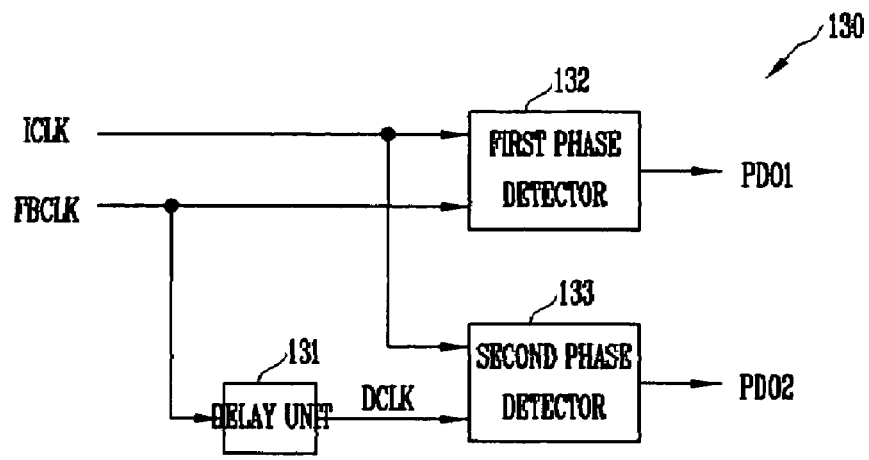
FIG. 3 shows in detail the phase detector in FIG. 2 in accordance with an exemplary embodiment of the present invention.
Figure 4A:
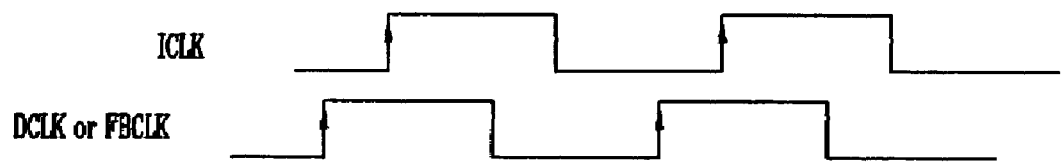
FIGS. 4a and 4b show timing of signals relating to the operations of the first phase detector and the second phase detector in FIG. 3 in accordance with an exemplary embodiment of the present invention.
Figure 4B:
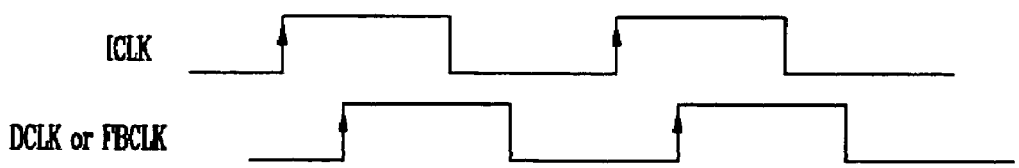

FIG. 3 shows in detail the phase detector in FIG. 2. Referring to FIG. 3, the phase detector 130 includes a delay unit 131, a first phase detector 132 and a second phase detector 133. The delay unit 131 delays the feedback clock signals FBCLK during unit delay time, and outputs unit delay clock signals DCLK. Preferably, the unit delay time of the delay unit 131 may be set to be equal to the unit coarse delay time DF1. The first phase detector 132 detects phase difference between the input clock signals ICLK and the feedback clock signals FBCLK, and outputs first phase detection signals PD01 according to the detection results. The second phase detector 133 detects phase difference between the unit delay clock signals DCLK and the input clock signals ICLK, and outputs second phase detection signals PD02 according to the detection results. Hereinafter, operations of the first phase detector 132 and the second phase detector 133 will be described in more detail with reference to FIGS. 4a and 4b. FIGS. 4a and 4b show timing of signals relating to the operations of the first phase detector and the second phase detector in FIG. 3. Referring to FIG. 4a, the first phase detector 132 outputs the first phase detection signals PD01 in a logic low state when the rising edge of the feedback clock signals FBCLK is earlier than that of the input clock signals ICLK. Likewise, the second phase detector 133 outputs the second phase detection signals PD02 in a logic low state when the rising edge of the unit delay clock signals DCLK is earlier than that of the input clock signals ICLK. Referring to FIG. 4b, the first phase detector 132 outputs the first phase detection signals PD01 in a logic high state when the rising edge of the input clock signals ICLK is earlier than that of the feedback clock signals FBCLK. Likewise, the second phase detector 133 outputs the second phase detection signals PD02 in a logic high state when the rising edge of the input clock signals ICLK is earlier than that of the unit delay clock signals DCLK.

Figure 6:
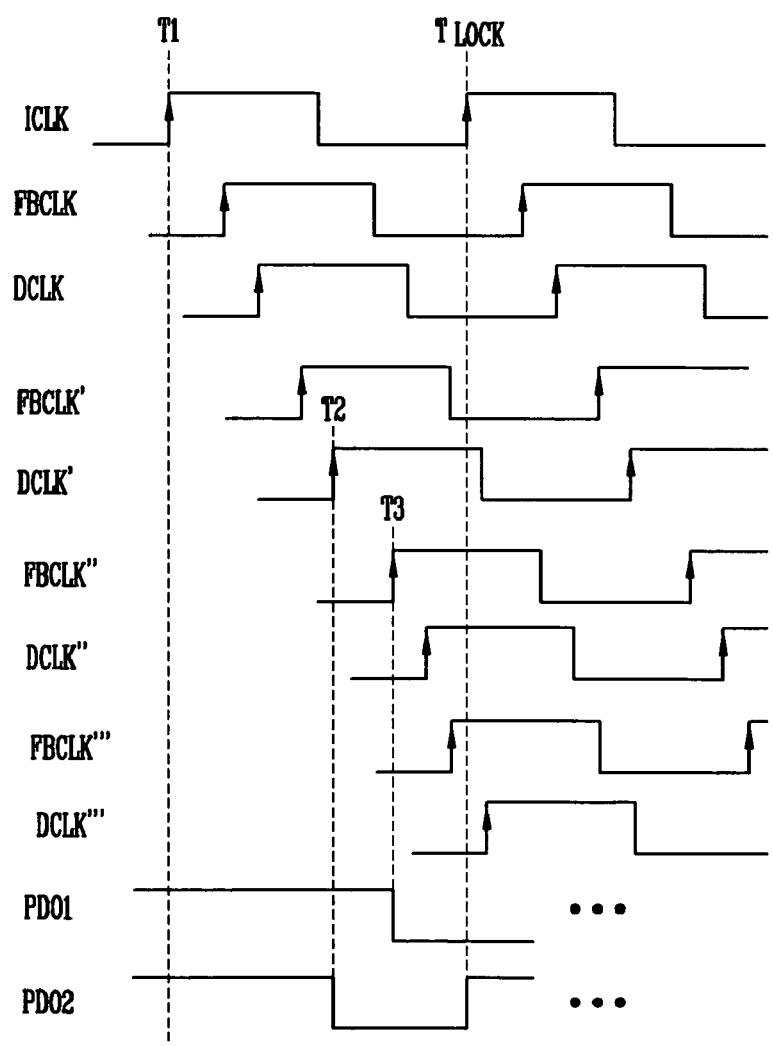
FIG. 6 shows timing of signals relating to the operation of the DLL in FIG. 2 in accordance with an exemplary embodiment of the present invention.

Hereinafter, a locking operation process of the DLL 100 will be described in detail with reference to FIG. 6. FIG. 6 shows timing of signals relating to the operation of the DLL 100 in FIG. 2. First, the input buffer 110 receives external clock signals ECLK, and outputs input clock signals ICLK to the phase detector 130 and the coarse delay unit 151 of the delay line 150. In the initial operation of the DLL 100, the delay controller 140 outputs delay control signals CCTL and FCTL so that delay time of the delay line 150 has an initial value. The coarse delay unit 151 delays the input clock signals ICLK during coarse delay time of the initial value in response to the delay control signals CCTL, and outputs coarse delay clock signals FRCLK and SDCLK. The fine delay unit 152 of the delay line 150 selects one of multiple mixed signals generated by mixing the coarse delay clock signals FRCLK and SDCLK in response to the delay control signals FCTL, and outputs the selected signals as delay clock signals MCLK. The output buffer 160 outputs internal clock signals INLCLK, which include first and second clock signals RCLK and FCLK, in response to the delay clock signals MCLK. Then, a predetermined element (e.g. an output enable controller 207, see FIG. 7), which exists in an actual output path of the internal clock signals INLCLK, generates reference clock signals RFCLK based on the internal clock signals INLCLK. The phase detector 130 detects phase difference between the input clock signals ICLK and the reference clock signals RFCLK, and outputs phase detection signals PDET, which include first and second phase detection signals PD01 and PD02, according to the detection results. For example, in a time point T1, when feedback clock signals FBCLK are inputted to the first phase detector 132 of the phase detector 130, and when unit delay clock signals DCLK are inputted to the second phase detector 133 of the phase detector 130, the phase detector 130 outputs the first and second phase detection signals PD01 and PD02 in a logic high state, respectively. When the first and second phase detection signals PD01 and PD02 are in the logic high states, the delay controller 140 generates the delay control signals CCTL so that the coarse delay unit 151 increases the coarse delay time. As a result, the rising edge of the feedback clock signals FBCLK is shifted as expressed by FBCLK', and the rising edge of the unit delay clock signals DCLK is also shifted as expressed by DCLK'. Hereinafter, a process in which the coarse delay time is adjusted will be described in more detail. For example, the delay control signals CCTL may include multiple bits, and the delay controller 140 changes a bit value of the delay control signals CCTL, so that the coarse delay time can be adjusted.

In a time point T2, since the rising edge of the unit delay clock signals DCLK' is earlier than the rising edge of the input clock signals ICLK, the phase detector 130 outputs the second phase detection signals PD02 in a logic low state, and maintains the first phase detection signals PD01 in a logic high state. Even when the first phase detection signals PD01 are in a logic high state and the second phase detection signals PD02 are in a logic low state, the delay controller 140 generates the delay control signals CCTL so that the coarse delay unit 151 increases the coarse delay time. As a result, the rising edge of the feedback clock signals FBCLK' is shifted as expressed by FBCLK", and the rising edge of the unit delay clock signals DCLK' is also shifted as expressed by DCLK". In a time point T3, since the rising edge of the feedback clock signals FBCLK" is much earlier than the rising edge of the input clock signals ICLK, the phase detector 130 outputs the first and the second phase detection signals PD01 and PD02 in a logic low state, respectively. Even when the first and the second phase detection signals PD01 and PD02 are in logic low states, the delay controller 140 generates the delay control signals CCTL so that the coarse delay unit 151 increases the coarse delay time. As a result, the rising edge of the feedback clock signals FBCLK" is shifted as expressed by FBCLK''', and the rising edge of the unit delay clock signals DCLK" is also shifted as expressed by DCLK'''. In a time point $T_{LOCK}$, since the rising edge of the input clock signals ICLK is much earlier than the rising edge of the unit delay clock signals DCLK''', the phase detector 130 outputs the second phase detection signals PD02 in a logic high state, and maintains the first phase detection signals PD01 in a logic low state. When the first phase detection signals PD01 are in a logic low state and the second phase detection signals PD02 are in a logic high state, the delay controller 140 determines that the coarse delay unit 151 is locked, and fixes and outputs the bit value of the delay control signals CCTL. Then, the delay controller 140 changes the delay control signals FCTL according to the logic levels of the first phase detection signals PD01. Specifically, the delay control signals FCTL may include multiple bits, the delay controller 140 changes the bit value of the delay control signals FCTL according to the logic levels of the first phase detection signals PD01. As a result, the fine delay unit 152 selects another one of the multiple mixed signals in response to the delay control signals FCTL. Herein, whenever the bit value of the delay control signals FCTL changes, the fine delay unit 152 selects mixed signals different from the previously selected mixed signals. Then, the fine delay unit 152 repeats the afore-descried operation until phase difference between the feedback clock signals FBCLK and the input clock signals ICLK is included within a predetermined range. When the phase difference between the feedback clock signals FBCLK and the input clock signals ICLK is included within the predetermined range, the delay controller 140 fixes the bit value of the delay control signals FCTL, so that the fine delay unit 152 is locked. If the fine delay unit 152 is locked, the phase of the delay clock signals MCLK is fixed to be equal to one of the multiple mixed signals. Consequently, the output buffer 160 outputs the internal clock signals INLCLK, which include the first and the second clock signals RCLK and FCLK, in response to the delay clock signals MCLK, wherein the first and the second clock signals RCLK and FCLK have fixed phases, respectively.

Figure 7:
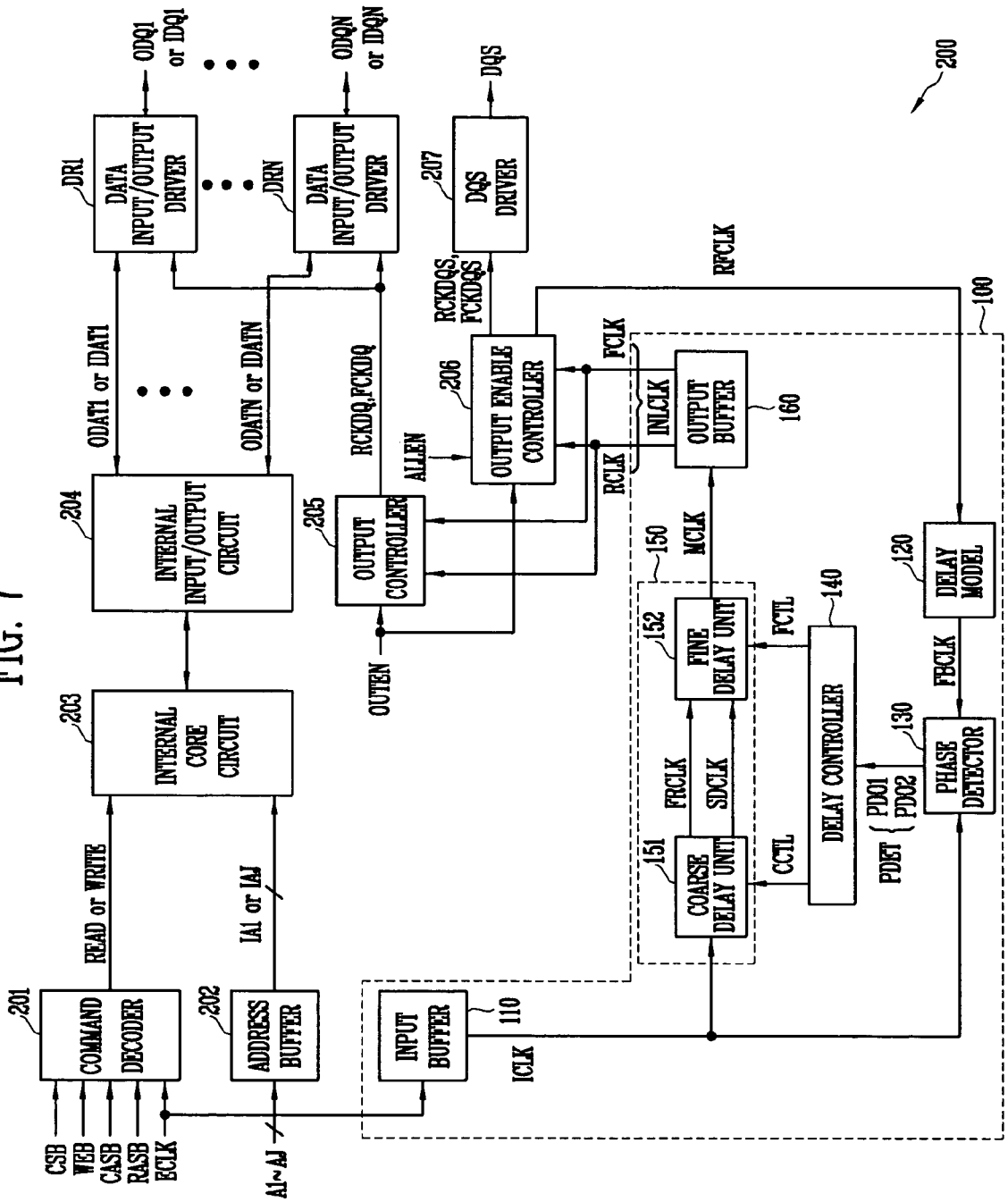
FIG. 7 schematically shows a semiconductor memory device in accordance with an exemplary embodiment of the present invention.

FIG. 7 schematically shows a semiconductor memory device in accordance with an exemplary embodiment of the present invention. FIG. 7 schematically shows only elements relating to the present invention from among the internal elements of the semiconductor memory device, for simplification of a drawing. Referring FIG. 7, the semiconductor memory device 200 includes the DLL 100, a command decoder 201, an address buffer 202, an internal core circuit 203, an internal input/output circuit 204, an output controller 205, an output enable controller 206, data input/output drivers DR1 to DRN (N is an integer), and the DQS driver 207. The DLL 100 includes the input buffer 110, the delay model 120, the phase detector 130, the delay controller 140, the delay line 150 and the output buffer 160. Since the construction and detailed operation of the DLL 100 are similar to those described with reference to FIG. 2, details will be omitted for convenience of description. The command decoder 201 outputs a read command READ and a write command WRITE to the internal core circuit 203 in response to external clock signals ECLK and external control signals including chip selection signals CSB, write enable signals WEB, column address strobe signals CASB and row address strobe signals RASB. The address buffer 202 receives external address signals A1 to AJ (J is an integer), and outputs input address signals IA1 to IAJ to the internal core circuit 203. The internal core circuit 203 includes a memory cell array having multiple memory cells, and peripheral circuits thereof (not shown in detail in FIG. 7). In the read operation of the semiconductor memory device 200, the internal input/output circuit 204 outputs internal output data signals ODAT1 to ODATN, which are received from the internal core circuit 203, to the data input/output drivers DR1 to DRN, respectively. In the write operation of the semiconductor memory device 200, the internal input/output circuit 204 outputs internal input data signals IDAT1 to IDATN, which are respectively received from the data input/output drivers DR1 to DRN, to the internal core circuit 203.

The output controller 205 outputs output control signals RCKDQ and FCKDQ in response to both the internal clock signals INLCLK received from the DLL 100 and output enable signals OUTEN. Specifically, the internal clock signals INLCLK include first and second clock signals RCLK and FCLK. When the output enable signals OUTEN are enabled, the output controller 205 outputs the output control signals RCKDQ based on the first clock signals RCLK, and outputs the output control signals FCKDQ based on the second clock signals FCLK. The output enable controller 206 outputs internal strobe signals RCKDQS and FCKDQS and the reference clock signals RFCLK in response to the output enable signals OUTEN and the first and the second clock signals RCLK and FCLK. Preferably, the output enable controller 206 consecutively outputs the reference clock signals RFCLK while the first and the second clock signals RCLK and FCLK are received, i.e. the DLL 100 is in an active state. Further, the output enable controller 206 outputs the internal strobe signals RCKDQS and FCKDQS only when the output enable signals OUTEN are enabled.

In the read operation of the semiconductor memory device 200, the data input/output drivers DR1 to DRN respectively output the internal output data signals ODAT1 to ODATN, which are received from the internal input/output circuit 204, to external devices (not shown) as output data signals ODQ1 to ODQN in response to the output control signals RCKDQ and FCKDQ. Further, in the write operation of the semiconductor memory device 200, the data input/output drivers DR1 to DRN output input data signals IDQ1 to IDQN, which are received from the external devices, to the internal input/output circuit 204 as the internal input data signals IDAT1 to IDATN. The DQS driver 207 outputs data strobe signals DQS to the external device in response to the internal strobe signals RCKDQS and FCKDQS. As a result, the external device receives the output data signals ODQ1 to ODQN in synchronization with the data strobe signals DQS.

In FIG. 7, the output enable controller 206 generates the reference clock signals RFCLK. However, the output buffer 160 of the DLL 100 may also generate the reference clock signals RFCLK. In such a case, the output buffer 160 generates the internal clock signals INLCLK and the reference clock signals RFCLK in response to the delay clock signals MCLK. Further, the output buffer 160 further includes a logic circuit for generating the reference clock signals RFCLK. In such a case, the predetermined delay time of the delay module 120 must further increase. The predetermined delay time of the delay module 120 may be set to be equal to the delay time of circuits (e.g. the output buffer 160, the output enable controller 206, and the DQS driver 207) that exist in an actual output path of the delay clock signals MCLK. In other words, the delay time of the delay module 120 may be set as time from the time point at which the output buffer 160 has generated the internal clock signals INLCLK to the time point at which the DQS driver 207 outputs the data strobe signals DQS.

Figure 8:
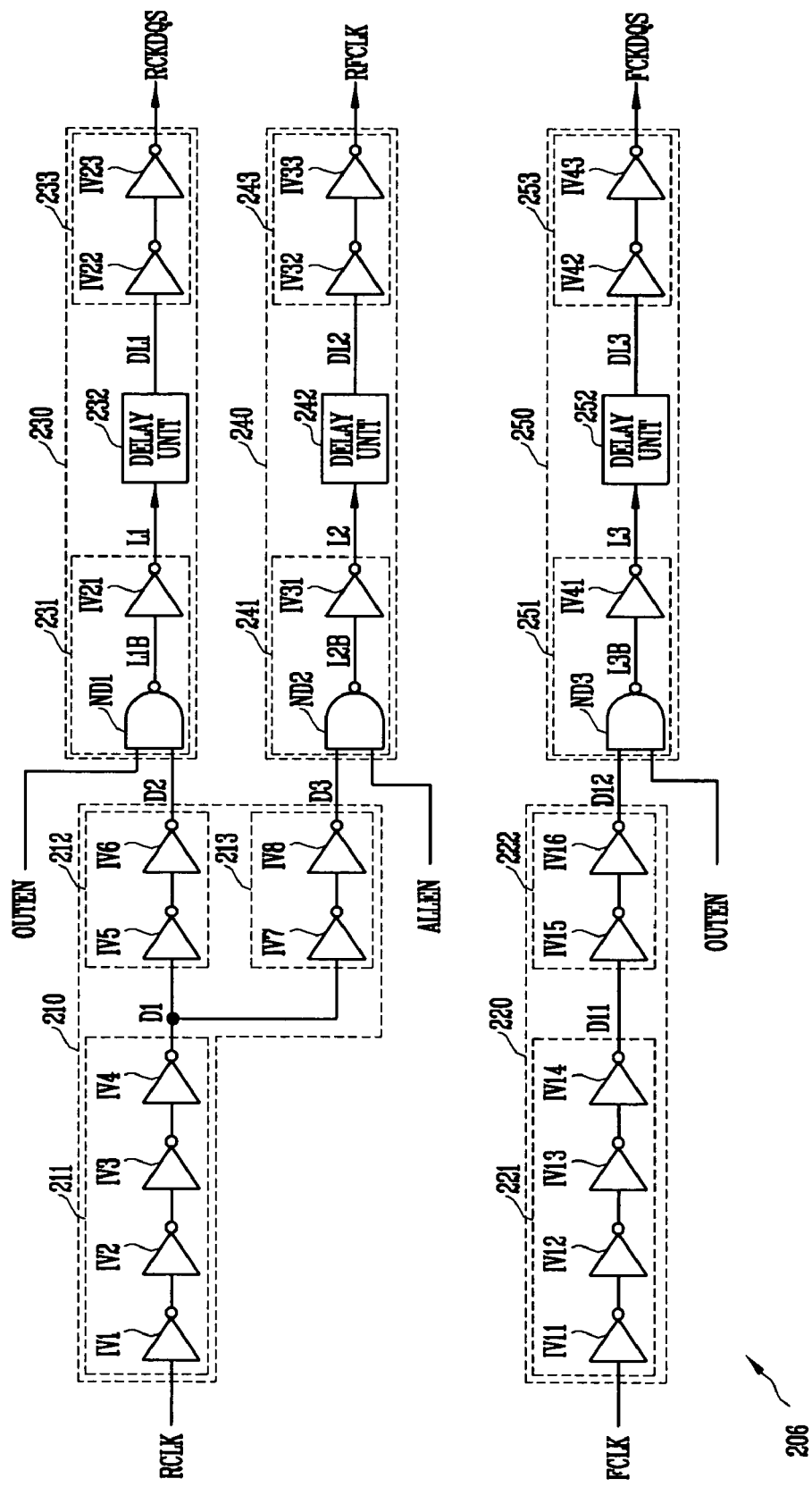
FIG. 8 shows a detailed logic circuit of the output enable controller in FIG. 7 in accordance with an exemplary embodiment of the present invention.

FIG. 8 shows a detailed logic circuit of the output enable controller in FIG. 7. Referring to FIG. 8, the output enable controller 206 includes logic circuits 210, 220, 230, 240 and 250. The logic circuit 210 includes delay logic circuits 211 to 213. The delay logic circuit 211 includes inverters IV1 to IV4 connected in series. The inverters IV1 to IV4 delay the first clock signals RCLK during first predetermined time, and outputs internal delay signals D1. The delay logic circuit 212 includes inverters IV5 and IV6 connected in series. The inverters IV5 and IV6 delay the internal delay signals D1 during second predetermined time, and outputs the delayed signals as logic signals D2. The delay logic circuit 213 includes inverters IV7 and IV8 connected in series. The inverters IV7 and IV8 delay the internal delay signals D1 during third predetermined time, and outputs the delayed signals as logic signals D3. Preferably, the first predetermined time is much longer than the second predetermined time, and is much longer than the third predetermined time.

The logic circuit 220 includes delay logic circuits 221 and 222. The delay logic circuit 221 includes inverters IV11 to IV14 connected in series. The inverters IV11 to IV14 delay the second clock signals FCLK during the first predetermined time, and outputs internal delay signals D1. The delay logic circuit 222 includes inverters IV15 and IV16 connected in series. The inverters IV15 and IV16 delay the internal delay signals D11 during the second predetermined time, and outputs the delayed signals as logic signals D12.

The logic circuit 230 includes internal logic circuits 231 and 233 and a delay unit 232. The internal logic circuit 231 outputs internal logic signals L1 in response to the output enable signals OUTEN and the logic signals D2. The internal logic circuit 231 includes a NAND gate ND1 and an inverter IV21. The NAND gate ND1 receives the output enable signals OUTEN and the logic signals D2, and outputs internal signals L1B. When the output enable signals OUTEN are enabled, the NAND gate ND1 outputs the internal signals L1B in a logic high or low state according to the logic values of the logic signals D2. When the output enable signals OUTEN are disabled, the NAND gate ND1 outputs the internal signals L1B in a logic high state regardless of the logic values of the logic signals D2. The inverter IV21 inverts the internal signals L1B, and outputs the inverted signals as the internal logic signals L1. The delay unit 232 delays the internal logic signals L1 during fourth predetermined time, and outputs delay logic signals DL1. The internal logic circuit 233 outputs internal strobe signals RCKDQS in response to the delay logic signals DL1. The internal logic circuit 233 includes inverters IV22 and IV23 connected in series.

The logic circuit 240 includes internal logic circuits 241 and 243 and a delay unit 242. The internal logic circuit 241 outputs internal logic signals L2 in response to enable signals ALLEN and the logic signals D3. The internal logic circuit 241 includes a NAND gate ND2 and an inverter IV31. The NAND gate ND2 receives the enable signals ALLEN and the logic signals D3, and outputs internal signals L2B. The enable signals ALLEN are maintained at an internal voltage VDD level. Accordingly, the NAND gate ND2 outputs the internal signals L2B in a logic high or low state according to the logic values of the logic signals D3. The inverter IV31 inverts the internal signals L2B, and outputs the inverted signals as the internal logic signals L2. The delay unit 242 delays the internal logic signals L2 during the fourth predetermined time, and outputs delay logic signals DL2. The internal logic circuit 243 outputs reference clock signals RFCLK in response to the delay logic signals DL2. The internal logic circuit 243 includes inverters IV32 and IV33 connected in series.

The logic circuit 250 includes internal logic circuits 251 and 253 and a delay unit 252. The internal logic circuit 251 outputs internal logic signals L3 in response to the output enable signals OUTEN and the logic signals D12. The internal logic circuit 251 includes a NAND gate ND3 and an inverter IV41. The NAND gate ND3 receives the output enable signals OUTEN and the logic signals D12, and outputs internal signals L3B. When the output enable signals OUTEN are enabled, the NAND gate ND2 outputs the internal signals L3B in a logic high or low state according to the logic values of the logic signals D12. When the output enable signals OUTEN are disabled, the NAND gate ND2 outputs the internal signals L3B in a logic high state regardless of the logic values of the logic signals D12. The inverter IV41 inverts the internal signals L3B, and outputs the inverted signals as the internal logic signals L3. The delay unit 252 delays the internal logic signals L3 during the fourth predetermined time, and outputs delay logic signals DL3. The internal logic circuit 253 outputs internal strobe signals FCKDQS in response to the delay logic signals DL3. The internal logic circuit 253 includes inverters IV42 and IV43 connected in series.

Hereinafter, the read operation process of the semiconductor memory device will be described. First, the command decoder 201 outputs a read command to the internal core circuit 203 in response to the external clock signals ECLK, the chip selection signals CSB, the write enable signals WEB, the column address strobe signals CASB and the row address strobe signals RASB. Further, the address buffer 202 receives external address signals A1 to AJ, and outputs input address signals IA1 to IAJ to the internal core circuit 203. Initially, the DLL 100 outputs internal clock signals INLCLK, which include first and second clock signals RCLK and FCLK, in response to the external clock signals ECLK, while not being locked. Accordingly, the phases of the first and the second clock signals RCLK and FCLK are altered while the DLL 100 performs a locking operation. The output enable controller 206 generates reference clock signals RFCLK in response to the first and the second clock signals RCLK and FCLK and enable signals ALLEN. The DLL 100 delays the reference clock signals RFCLK to generate feedback clock signals FBCLK, and performs the locking operation based on the feedback clock signals FBCLK and the input clock signals ECLK. When the DLL 100 is locked, i.e. the DLL 100 completes the locking operation, the DLL 100 outputs the first and the second clock signals RCLK and FCLK, which have fixed phases, respectively.

The internal core circuit 203 reads data from memory cells, which correspond to the input address signals IA1 to IAJ, in response to the read command, and outputs internal output data signals ODAT1 to ODATN to the internal input/output circuit 204. The internal input/output circuit 204 outputs the internal output data signals ODAT1 to ODATN, which are received from the internal core circuit 203, to the data input/output drivers DR1 to DRN, respectively. Herein, the output enable signals OUTEN are enabled. The output controller 205 outputs output control signals RCKDQ and FCKDQ in response to the output enable signals OUTEN and the first and the second clock signals RCLK and FCLK. Further, the output enable controller 206 outputs internal strobe signals RCKDQS and FCKDQS in response to the output enable signals OUTEN and the first and the second clock signals RCLK and FCLK. The data input/output drivers DR1 to DRN output internal output data signals ODAT1 to ODATN to external devices, respectively, as output data signals ODQ1 to ODQN, in response to the output control signals RCKDQ and FCKDQ. Further, the DQS driver 207 outputs data strobe signals DQS to the external device in response to the internal strobe signals RCKDQS and FCKDQS.

As described above, the DLL 100 delays the reference clock signals RFCLK generated by the output enable controller 206 that exists in an actual output path of the internal clock signals INLCLK, thereby generating feedback clock signals FBCLK. Accordingly, skew between data strobe signals/output data signals and external clock signals, which may occur according to conditions in manufacturing processes, can be reduced. Further, since the DLL 100 includes only the delay model 120 having delay time corresponding to delay time due to the DQS driver 207, the DLL 100 may have a reduced occupation area.

Figure 9:
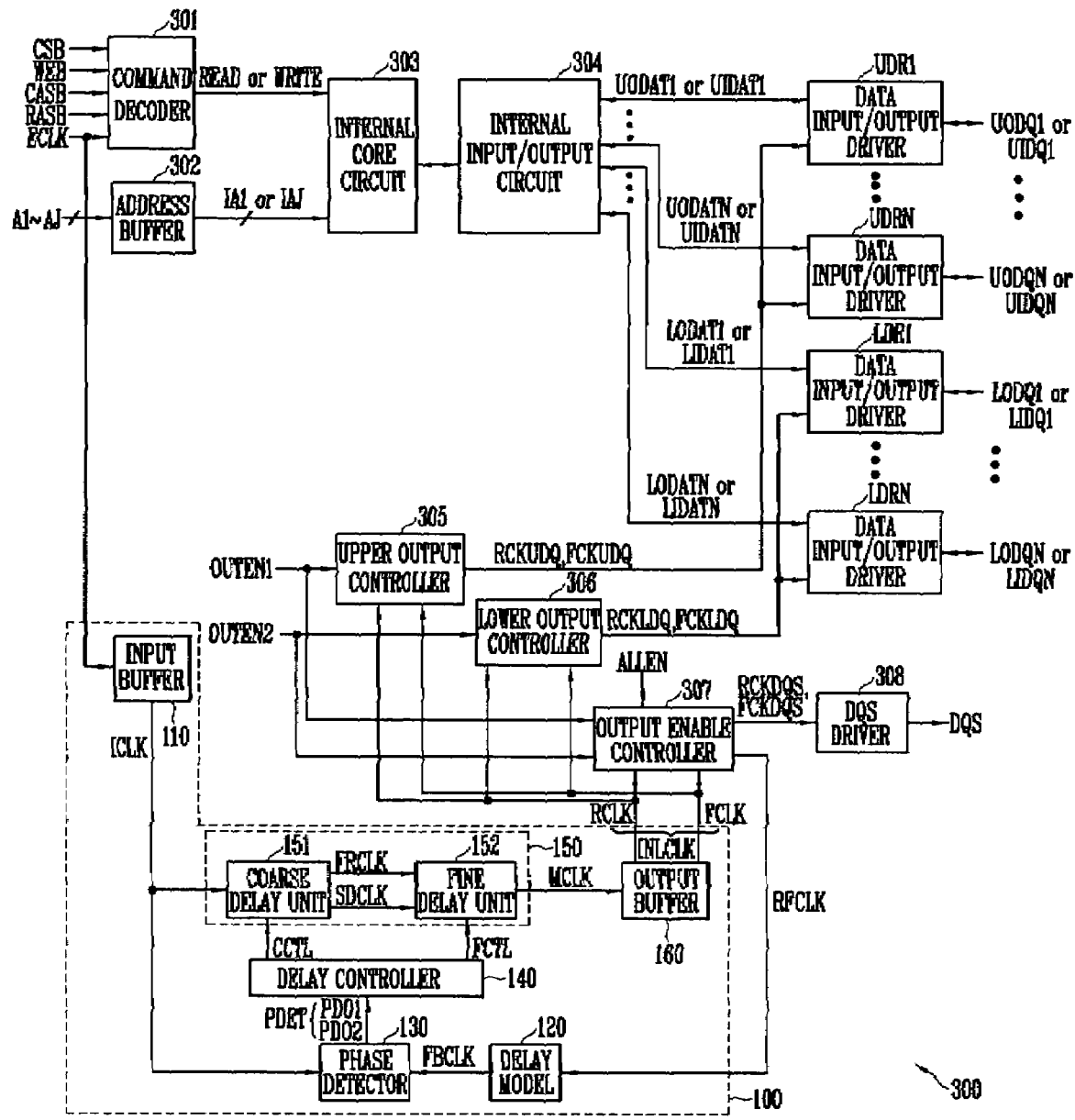
FIG. 9 schematically shows a semiconductor memory device in accordance with an exemplary embodiment of the present invention.

FIG. 9 schematically shows a semiconductor memory device in accordance with an exemplary embodiment of the present invention. Referring FIG. 9, the semiconductor memory device 300 includes the DLL 100, a command decoder 301, an address buffer 302, an internal core circuit 303, an internal input/output circuit 304, an upper output controller 305, a lower output controller 306, an output enable controller 307, data input/output drivers UDR1 to UDRN and LDR1 to LDRN (N is an integer), and a DQS driver 308. The construction and detailed operation of the semiconductor memory device 300 are similar to those of the semiconductor memory device 200 described with reference to FIG. 7. Accordingly, in the present embodiment, differences between the semiconductor memory device 200 and the semiconductor memory device 300 will be mainly described. The differences between the semiconductor memory device 200 and the semiconductor memory device 300 lies in that the semiconductor memory device 300 includes the upper output controller 305, the lower output controller 306, and the data input/output drivers UDR1 to UDRN and LDR1 to LDRN. The upper output controller 305 generates output control signals RCKUDQ and FCKUDQ in response to both output enable signals OUTEN1 and internal clock signals INLCLK that include first and second clock signals RCLK and FCLK received from the DLL 100. Specifically, when the output enable signals OUTEN1 are enabled, the upper output controller 305 outputs the output control signals RCKUDQ based on the first clock signals RCLK, and outputs the output control signals FCKUDQ based on the second clock signals FCLK. The lower output enable controller 306 generates output control signals RCKLDQ and FCKLDQ in response to output enable signals OUTEN2 and the internal clock signals INLCLK. More specifically, when the output enable signals OUTEN2 are enabled, the upper output controller 305 outputs the output control signals RCKLDQ based on the first clock signals RCLK, and outputs the output control signals FCKLDQ based on the second clock signals FCLK. When the output enable signals OUTEN1 or the output enable signals OUTEN2 are enabled, the other one is disabled. Accordingly, when the upper output controller 305 outputs the output control signals RCKUDQ and FCKUDQ, the lower output enable controller 306 does not output the output control signals RCKLDQ and FCKLDQ. However, when the lower output enable controller 306 outputs the output control signals RCKLDQ and FCKLDQ, the upper output controller 305 does not output the output control signals RCKUDQ and FCKUDQ.

In the read operation of the semiconductor memory device 300, the data input/output drivers UDR1 to UDRN output internal output data signals UODAT1 to UODATN, which are received from the internal input/output circuit 304, to external devices (not shown), respectively, as output data signals UODQ1 to UODQN in response to the output control signals RCKUDQ and FCKUDQ. In the write operation of the semiconductor memory device 300, the data input/output drivers UDR1 to UDRN output input data signals UIDQ1 to UIDQN, which are received from the external devices, to the internal input/output circuit 304, respectively, as internal input data signals UIDAT1 to UIDATN. In the read operation of the semiconductor memory device 300, the data input/output drivers LDR1 to LDRN output internal output data signals LODAT1 to LODATN, which are received from the internal input/output circuit 304, to the external devices, respectively, as output data signals LODQ1 to LODQN in response to the output control signals RCKLDQ and FCKLDQ. In the write operation of the semiconductor memory device 300, the data input/output drivers LDR1 to LDRN output input data signals LIDQ1 to LIDQN, which are received from the external devices, to the internal input/output circuit 304, respectively, as internal input data signals LIDAT1 to LIDATN. When the output enable signals OUTEN1 or output enable signals OUTEN2 are enabled, the output enable controller 307 generates internal strobe signals RCKDQS and FCKDQS based on the first and the second clock signals RCLK and FCLK. The DQS driver 308 outputs data strobe signals DQS to the external devices in response to the internal strobe signals RCKDQS and FCKDQS. As a result, the external devices receive the output data signals UODQ1 to UODQN or LODQ1 to LODQN in synchronization with the data strobe signals DQS.

Figure 10:
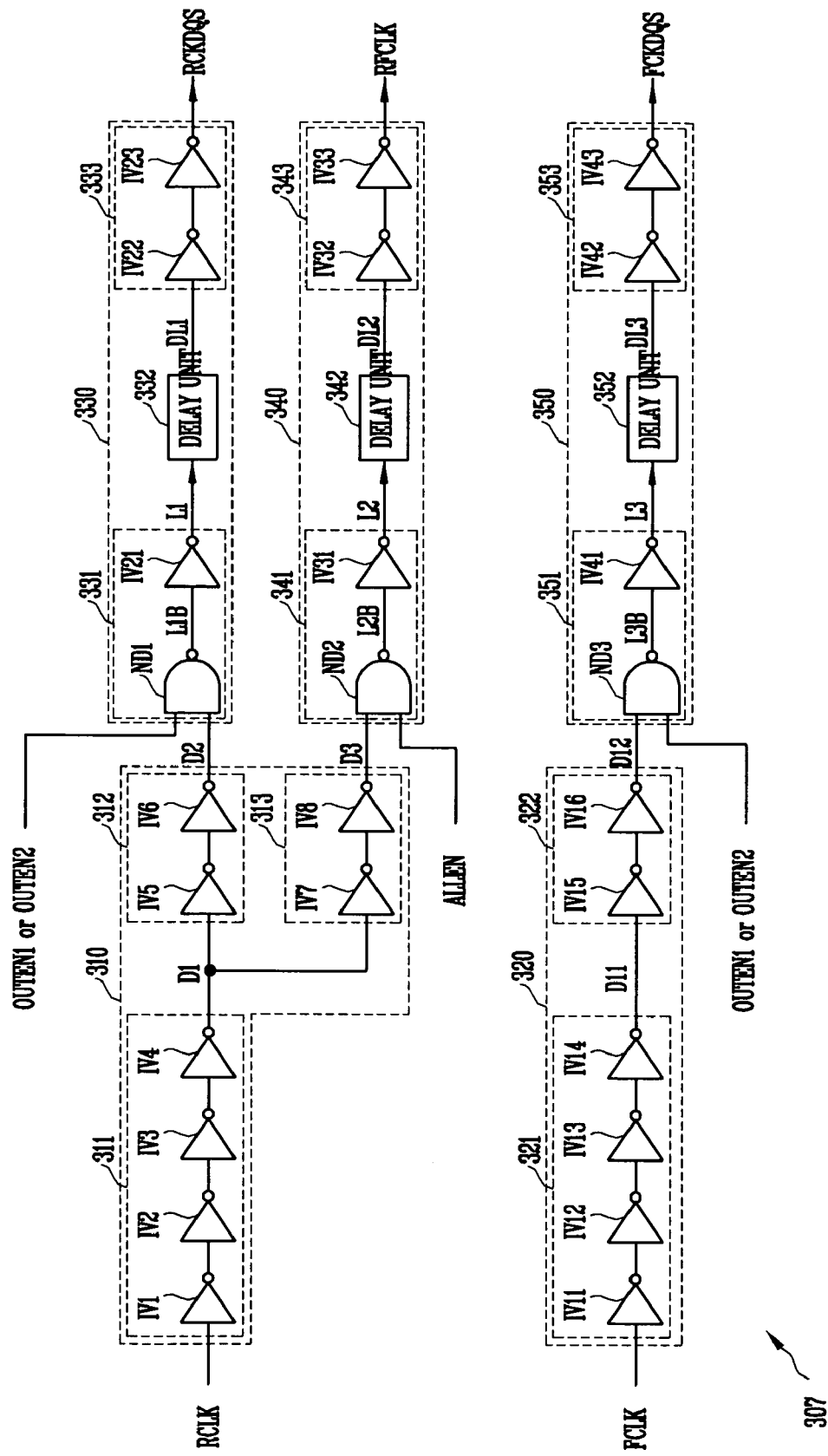
FIG. 10 shows a detailed logic circuit of the output enable controller in FIG. 9 in accordance with an exemplary embodiment of the present invention.

FIG. 10 shows a detailed logic circuit of the output enable controller in FIG. 9. Referring to FIG. 10, the output enable controller 307 includes logic circuits 310, 320, 330, 340 and 350. Since the construction and detailed operation of the output enable controller 307 are similar to those of the output enable controller 206 descried with reference to FIG. 8, except for one difference, details will be omitted for convenience of description. The difference lies in that the logic circuits 330 and 350 of the output enable controller 307 operate in response to the output enable signals OUTEN1 or the output enable signals OUTEN2.

Figure 11:
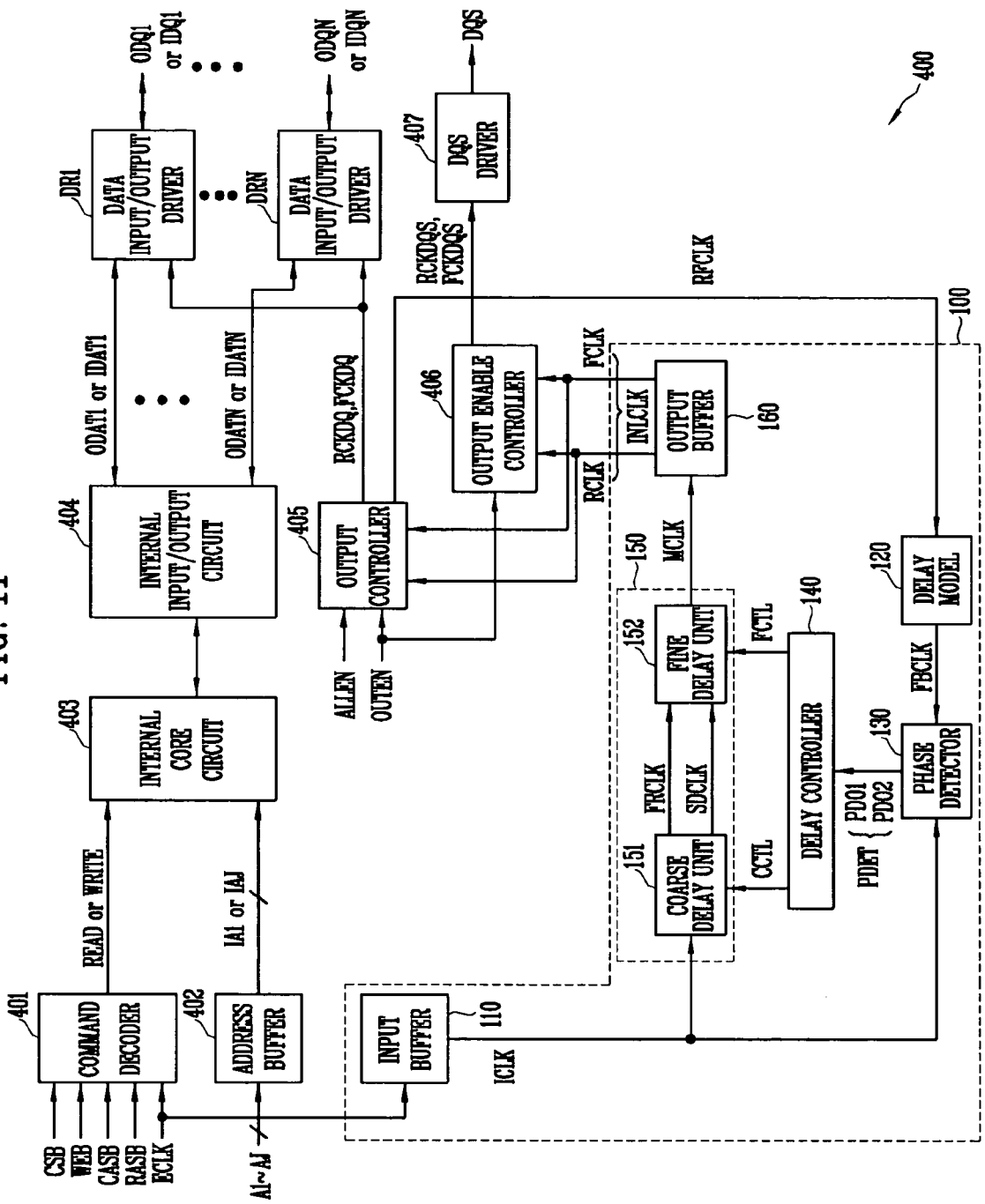
FIG. 11 schematically shows a semiconductor memory device in accordance with an exemplary embodiment of the present invention.

FIG. 11 schematically shows a semiconductor memory device in accordance with an exemplary embodiment of the present invention. Referring FIG. 11, the semiconductor memory device 400 includes the DLL 100, a command decoder 401, an address buffer 402, an internal core circuit 403, an internal input/output circuit 404, an output controller 405, an output enable controller 406, data input/output drivers DR1 to DRN (N is an integer), and a DQS driver 407. The construction and detailed operation of the semiconductor memory device 400 are similar to those of the semiconductor memory device 200 described with reference to FIG. 7. Accordingly, in the present embodiment, differences between the semiconductor memory device 200 and the semiconductor memory device 400 will be mainly described. The difference between the semiconductor memory device 200 and the semiconductor memory device 400 lies in that the output controller 405 further generates reference clock signals RFCLK. The output controller 405 outputs output control signals RCKDQ and FCKDQ and the reference clock signals RFCLK in response to both output enable signals OUTEN and first and second clock signals RCLK and FCLK. Preferably, the output controller 405 consecutively outputs the reference clock signals RFCLK while the first and the second clock signals RCLK and FCLK are received, i.e. the DLL 100 is in an active state. Further, the output controller 405 outputs the output control signals RCKDQ and FCKDQ only when the output enable signals OUTEN are enabled. In the present embodiment, the semiconductor memory device 400 including one output controller 405 is described as one example. However, the present embodiment may be applied even when the semiconductor memory device 400 includes multiple output controllers as in the case of the semiconductor memory device 300 shown in FIG. 9. In other words, the upper output controller 305 or the lower output controller 306 of the semiconductor memory device 300 may also generate the reference clock signals RFCLK.

Figure 12:
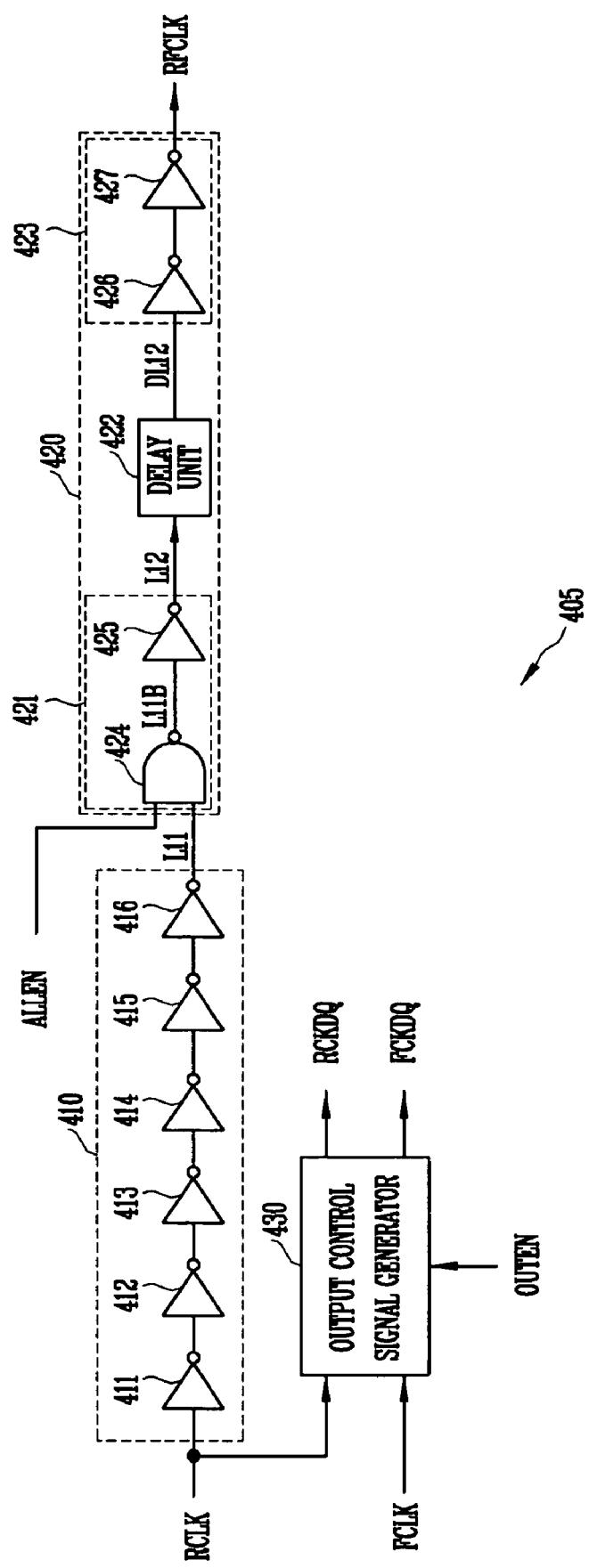
FIG. 12 shows in detail of the output controller in FIG. 11 in accordance with an exemplary embodiment of the present invention.

FIG. 12 shows in detail the output controller in FIG. 11. Referring to FIG. 12, the output controller 405 includes logic circuits 410 and 450 and an output control signal generator 430. The logic circuit 410 outputs logic signals L11 in response to the first clock signals RCLK. Specifically, the logic circuit 410 includes inverters 411 to 416 connected in series. The inverters 411 to 416 delay the first clock signals RCLK during fifth predetermined time, and output the delayed signals as the logic signals L11. The logic circuit 420 outputs the reference clock signals RFCLK in response to the logic signals L11. More specifically, the logic circuit 420 includes internal logic circuits 421 and 423 and a delay unit 422. The internal logic circuit 421 outputs internal logic signals L12 in response to enable signals ALLEN and the logic signals L11. The internal logic circuit 421 includes a NAND gate 424 and an inverter 425. The NAND gate 424 receives the enable signals ALLEN and the logic signals L11, and outputs internal signals L11B. The enable signals ALLEN are maintained at an internal voltage VDD level. Accordingly, the NAND gate 424 outputs the internal signals L11B in a logic high or low state according to the logic values of the logic signals L11. The inverter 425 inverts the internal signals L11B, and outputs the inverted signals as the internal logic signals L12. The delay unit 422 delays the internal logic signals L12 during the fourth predetermined time, and outputs delay logic signals DL12. The internal logic circuit 423 outputs the reference clock signals RFCLK in response to the delay logic signals DL12. The internal logic circuit 423 includes inverters 426 and 427 connected in series. The output control signal generator 430 outputs output control signals RCKDQ and FCKDQ in response to the first and the second clock signals RCLK and FCLK and output enable signals OUTEN.

As described above, According to a DLL, a semiconductor memory device including the DLL, and a locking operation method of the same, it is possible to reduce skew between data strobe signals/output data signals and external clock signals, which may occur according to conditions in manufacturing processes, and to reduce the occupation area of the DLL.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit of scope of the invention. Thus, the present invention is not intended to be limited to the embodiments shown herein.

What is claimed is:

1. A Delay Locked Loop (DLL) comprising:
   a phase detector for detecting phase difference between input clock signals and feedback clock signals, and outputting phase detection signals according to results of the detection;
   a delay line for delaying the input clock signals in response to first and second delay control signals, and outputting delay clock signals;
   a delay controller for generating the first and the second delay control signals in response to the phase detection signals; and
   a delay model for delaying reference clock signals during predetermined time, and outputting the delayed signals as the feedback clock signals,
   wherein the reference clock signals are generated by one of circuits that exist in an actual output path of the delay clock signals.

2. The DLL as claimed in claim 1, further comprising an input buffer for receiving external clock signals and outputting the external clock signals as the input clock signals.

3. The DLL as claimed in claim 1, wherein the circuits that exist in the actual output path of the delay clock signals comprise:
   an output buffer for outputting internal clock signals in response to the delay clock signals;
   an output enable controller for outputting the reference clock signals and internal strobe signals in response to the internal clock signals; and
   a Data Queue Strobe (DQS) driver for outputting data strobe signals in response to the internal strobe signals.

4. The DLL as claimed in claim 3, wherein the predetermined time is set to be equal to time required when the DQS driver receives the internal strobe signals and outputs the data strobe signals.

5. The DLL as claimed in claim 3, wherein the internal clock signals include first and second clock signals, which are complementary to each other, and the output enable controller comprises:
   a first logic circuit for outputting first and second logic signals in response to the first clock signals;
   a second logic circuit for outputting the internal strobe signals in response to the first logic signals and output enables signals; and
   a third logic circuit for outputting the reference clock signals in response to the second logic signals.

6. The DLL as claimed in claim 5, wherein the first logic circuit comprises:
   a first delay logic circuit for delaying the first clock signals during first predetermined time, and outputting internal delay signals;
   a second delay logic circuit for delaying the internal delay signals during second predetermined time, and outputting the delayed signals as the first logic signals; and
   a third delay logic circuit for delaying the internal delay signals during third predetermined time, and outputting the delayed signals as the second logic signals.

7. The DLL as claimed in claim 6, wherein the first predetermined time is much longer than the second predetermined time, and is much longer than the third predetermined time.

8. The DLL as claimed in claim 5, wherein the second logic circuit outputs the internal strobe signals based on the first logic signals while output enables signals are enabled, and the third logic circuit consecutively outputs the reference clock signals while the second logic signals are received.

9. The DLL as claimed in claim 5, wherein the second logic circuit comprises:
   a first internal logic circuit for outputting first internal logic signals in response to the output enables signals and the first logic signals;
   a delay unit for delaying the first internal logic signals during first predetermined time, and outputting delay logic signals; and a second internal logic circuit for outputting the internal strobe signals in response to the delay logic signals.

10. The DLL as claimed in claim 5, wherein the third logic circuit comprises:
a first internal logic circuit for outputting first internal logic signals in response to enables signals and the second logic signals;
a delay unit for delaying the first internal logic signals during first predetermined time, and outputting delay logic signals; and
a second internal logic circuit for outputting the reference clock signals in response to the delay logic signals.

11. The DLL as claimed in claim 10, wherein the enables signals are maintained in a logic high state, and the first internal logic circuit comprises:
a NAND gate for receiving the enables signals and the second logic signals, and outputting internal signals; and
an inverter for inverting the internal signals and outputting the inverted signals as the first internal logic signals.

12. The DLL as claimed in claim 1, wherein the delay line comprises:
a coarse delay unit for adjusting coarse delay time in response to the first delay control signals, delaying the input clock signals during the adjusted coarse delay time, and outputting first and second coarse delay clock signals; and
a fine delay unit for mixing the first and the second coarse delay clock signals in response to the second delay control signals, selecting one of multiple mixed signals having different phases, which exist between the first and the second coarse delay clock signals, and outputting the selected signals as the delay clock signals.

13. The DLL as claimed in claim 12, wherein the phase detection signals include first and second detection signals, and the phase detector comprises:
a delay unit for delaying the feedback clock signals during unit delay time, and outputting unit delay clock signal;
a first phase detector for detecting phase difference between the input clock signals and the feedback clock signals, and outputting the first detection signals according to results of the detection; and
a second phase detector for detecting phase difference between the unit delay clock signals and the input clock signals, and outputting the second phase detection signals according to results of the detection.

14. The DLL as claimed in claim 13, wherein the coarse delay unit alternatively shifts rising edges of the first and the second coarse delay clock signals by unit coarse delay time whenever the first delay control signals are received, and the unit delay time is set to be equal to the unit coarse delay time.

15. The DLL as claimed in claim 13, wherein the first phase detector outputs the first detection signals in a logic high state when a rising edge of the input clock signals is earlier than a rising edge of the feedback clock signals, and outputs the first detection signals in a logic low state when the rising edge of the feedback clock signals is earlier than the rising edge of the input clock signals, the second phase detector outputs the second phase signals in a logic high state when the rising edge of the input clock signals is earlier than the rising edge of the unit delay clock signals, and outputs the second phase signals in a logic low state when the rising edge of the unit delay clock signals is earlier than the rising edge of the input clock signals, and the delay controller generates the first delay control signals so that the coarse delay unit increases the coarse delay time when the first and the second detection signals are logic high states or low states, and determines that the coarse delay unit has been locked when the second detection signals are switched from a logic low state to a logic high state.

16. The DLL as claimed in claim 1, wherein the reference clock signals are consecutively toggled while the DLL is in an active state.

17. A semiconductor memory device comprising:
a Delay Locked Loop (DLL) for generating internal clock signals based on external clock signals and reference clock signals;
an output enable controller for outputting internal strobe signals and the reference clock signals in response to the internal clock signals and output enable signals; and
a Data Queue Strobe (DQS) driver for outputting data strobe signals to external devices in response to the internal strobe signals;
wherein the DLL comprises:
an input buffer for receiving the external clock signals and outputting input clock signals;
a phase detector for detecting phase difference between the input clock signals and feedback clock signals, and outputting phase detection signals according to results of the detection;
a delay line for delaying the input clock signals in response to first and second delay control signals, and outputting delay clock signals;
a delay controller for generating the first and the second delay control signals in response to the phase detection signals;
a delay model for delaying the reference clock signals during predetermined time, and outputting the delayed signals as the feedback clock signals; and
an output buffer for outputting the internal clock signals in response to the delay clock signals.

18. The semiconductor memory device as claimed in claim 17, further comprising:
an output controller for outputting output control signals in response to the internal clock signals and the output enable signals;
multiple data input/output drivers for receiving internal output data signals in response to the output control signals, and outputting output data signals to the external devices, respectively;
an internal input/output circuit for outputting the internal output data signals, which are received from an internal core circuit, to the multiple data input/output drivers, respectively;
a command decoder for outputting a read command or a write command to the internal core circuit in response to external control signals and the external clock signals; and
an address buffer for receiving external address signals and outputting input address signals to the internal core circuit.

19. The semiconductor memory device as claimed in claim 18, wherein, in a write operation of the semiconductor memory device, the multiple data input/output drivers receive input data signals from the external devices, respectively, and output the input data signals to the internal input/output circuit as internal input data signals, and the internal input/output circuit outputs the internal input data signals, which are respectively received from the multiple data input/output drivers, to the internal core circuit.

20. The semiconductor memory device as claimed in claim 17, wherein the predetermined time is set to be equal to time required when the DQS driver receives the internal strobe signals and outputs the data strobe signals.

21. The semiconductor memory device as claimed in claim 18, further comprising:
an additional output controller for outputting additional output control signals in response to the internal clock signals and additional output enable signals; and
additional data input/output drivers for receiving additional internal output data signals in response to the additional output control signals, and outputting additional output data signals to the external devices, respectively.

22. The semiconductor memory device as claimed in claim 21, wherein, when the output enable signals or the additional enable signals are enabled, remaining enable signals are disabled, and the output controller outputs the output control signals when the output enables signals are enabled, and the additional output controller outputs the additional output control signals when the additional enable signals are enabled.

23. The semiconductor memory device as claimed in claim 21, wherein, in a write operation of the semiconductor memory device, the additional data input/output drivers receive additional input data signals from the external devices, respectively, and output the additional input data signals to the internal input/output circuit as additional internal input data signals, and the internal input/output circuit outputs the additional internal input data signals, which are received from the additional data input/output drivers, to the internal core circuit, and, in a read operation of the semiconductor memory device, the internal input/output circuit outputs the additional internal output data signals, which are received from the internal core circuit, to the additional data input/output drivers, respectively.

24. The semiconductor memory device as claimed in claim 17, wherein the internal clock signals include first and second clock signals, which are complementary to each other, the internal strobe signals includes first and second internal strobe signals, and the output enable controller comprises:
a first logic circuit for outputting first and second logic signals in response to the first clock signals;
a second logic circuit for outputting the first internal strobe signals in response to the first logic signals and the output enables signals;
a third logic circuit for outputting the reference clock signals in response to the second logic signals;
a fourth logic circuit for outputting third logic signals in response to the second clock signals; and
a fifth logic circuit for outputting the second internal strobe signals in response to the third logic signals and the output enable signals.

25. The semiconductor memory device as claimed in claim 24, wherein the first logic circuit comprises:
a first delay logic circuit for delaying the first clock signals during first predetermined time, and outputting internal delay signals;
a second delay logic circuit for delaying the internal delay signals during second predetermined time, and outputting the delayed signals as the first logic signals; and
a third delay logic circuit for delaying the internal delay signals during third predetermined time, and outputting the delayed signals as the second logic signals.

26. The semiconductor memory device as claimed in claim 24, wherein the first predetermined time is much longer than the second predetermined time, and is much longer than the third predetermined time.

27. The semiconductor memory device as claimed in claim 24, wherein the second logic circuit outputs the internal strobe signals based on the first logic signals while the output enables signals are enabled, and the third logic circuit consecutively outputs the reference clock signals while the second logic signals are received.

28. The semiconductor memory device as claimed in claim 24, wherein the second logic circuit comprises:
a first internal logic circuit for outputting first internal logic signals in response to the output enables signals and the first logic signals;
a delay unit for delaying the first internal logic signals during first predetermined time, and outputting delay logic signals; and
a second internal logic circuit for outputting the internal strobe signals in response to the delay logic signals.

29. The semiconductor memory device as claimed in claim 24, wherein the third logic circuit comprises:
a first internal logic circuit for outputting first internal logic signals in response to enables signals and the second logic signals;
a delay unit for delaying the first internal logic signals during first predetermined time, and outputting delay logic signals; and
a second internal logic circuit for outputting the reference clock signals in response to the delay logic signals.

30. The semiconductor memory device as claimed in claim 29, wherein the enables signals are maintained in a logic high state, and the first internal logic circuit comprises:
a NAND gate for receiving the enables signals and the second logic signals, and outputting internal signals; and
an inverter for inverting the internal signals and outputting the inverted signals as the first internal logic signals.

31. The semiconductor memory device as claimed in claim 17, wherein the delay line comprises:
a coarse delay unit for adjusting coarse delay time in response to the first delay control signals, delaying the input clock signals during the adjusted coarse delay time, and outputting first and second coarse delay clock signals; and
a fine delay unit for mixing the first and the second coarse delay clock signals in response to the second delay control signals, selecting one of multiple mixed signals having different phases, which exist between the first and the second coarse delay clock signals, and outputting the selected signals as the delay clock signals.

32. The semiconductor memory device as claimed in claim 31, wherein the phase detection signals includes first and second detection signals, and the phase detector comprises:
a delay unit for delaying the feedback clock signals during unit delay time, and outputting unit delay clock signal;
a first phase detector for detecting phase difference between the input clock signals and the feedback clock signals, and outputting the first detection signals according to results of the detection; and
a second phase detector for detecting phase difference between the unit delay clock signals and the input clock signals, and outputting the second phase detection signals according to results of the detection.

33. The semiconductor memory device as claimed in claim 32, wherein the coarse delay unit alternatively shifts rising edges of the first and the second coarse delay clock signals by unit coarse delay time whenever the first delay control signals are received, and the unit delay time is set to be equal to the unit coarse delay time.

34. The semiconductor memory device as claimed in claim 32, wherein the first phase detector outputs the first detection signals in a logic high state when a rising edge of the input clock signals is earlier than a rising edge of the feedback clock signals, and outputs the first detection signals in a logic low state when the rising edge of the feedback clock signals is earlier than the rising edge of the input clock signals, the second phase detector outputs the second phase signals in a logic high state when the rising edge of the input clock signals is earlier than the rising edge of the unit delay clock signals, and outputs the second phase signals in a logic low state when the rising edge of the unit delay clock signals is earlier than the rising edge of the input clock signals, and the delay controller generates the first delay control signals so that the coarse delay unit increases the coarse delay time when the first and the second detection signals are logic high states or low states, and determines that the coarse delay unit has been locked when the second detection signals are switched from a logic low state to a logic high state.

35. A locking operation method of a Delay Locked Loop (DLL), the method comprising the steps of:
receiving external clock signals and outputting input clock signals;
generating reference clock signals through one of external circuits that exist in an actual output path of internal clock signals;
delaying the reference clock signals during predetermined time, and outputting the delayed signals as feedback clock signals;
detecting phase difference between the input clock signals and the feedback clock signals, and outputting phase detection signals according to results of the detection;
generating first and second delay control signals in response to the phase detection signals;
delaying the input clock signals in response to the first and the second delay control signals, and outputting delay clock signals; and
outputting the internal clock signals in response to the delay clock signals.

36. The method as claimed in claim 35, wherein the internal clock signals include first and second clock signals, which are complementary to each other, the step of generating the reference clock signals comprises the sub-steps of:
outputting first and second logic signals in response to the first clock signals; and
outputting the reference clock signals in response to the second logic signals.

37. The method as claimed in claim 36, wherein the step of outputting the first and the second logic signals comprises the sub-steps of:
delaying the first clock signals during first predetermined time, and outputting internal delay signals;
delaying the internal delay signals during second predetermined time, and outputting the delayed signals as the first logic signals; and
delaying the internal delay signals during third predetermined time, and outputting the delayed signals as the second logic signals.

38. The method as claimed in claim 36, wherein the step of outputting the reference clock signals comprises the sub-steps of:
outputting first internal logic signals in response to enables signals and the second logic signals;
delaying the first internal logic signals during first predetermined time, and outputting delay logic signals; and
outputting the reference clock signals in response to the delay logic signals.

39. A semiconductor memory device comprising:
a Delay Locked Loop (DLL) for generating internal clock signals based on external clock signals and reference clock signals;
a Data Queue Strobe (DQS) driver for outputting data strobe signals to external devices in response to internal strobe signals generated based on the internal clock signals; and
multiple data input/output drivers for, in a read operation of the semiconductor memory device, outputting internal output data signals, which are received from an internal core circuit through an internal input/output circuit of the semiconductor memory device, to the external devices, respectively, as output data signals in response to output control signals generated based on the internal clock signals,
wherein the reference clock signals are outputted from one of circuits that exist in an actual output path of the internal clock signals, which are disposed between an output terminal of the DLL and the DQS driver, or between the output terminal of the DLL and the multiple data input/output drivers.

40. The semiconductor memory device as claimed in claim 39, wherein the DLL comprises:
an input buffer for receiving the external clock signals and outputting input clock signals;
a phase detector for detecting phase difference between the input clock signals and feedback clock signals, and outputting phase detection signals according to results of the detection;
a delay line for delaying the input clock signals in response to first and second delay control signals, and outputting delay clock signals;
a delay controller for generating the first and the second delay control signals in response to the phase detection signals;
a delay model for delaying the reference clock signals during predetermined time, and outputting the delayed signals as the feedback clock signals; and
an output buffer for outputting the internal clock signals in response to the delay clock signals.

41. The semiconductor memory device as claimed in claim 40, wherein the predetermined time is set to be equal to time required when the multiple data input/output drivers or the DQS driver output(s) the data strobe signals or the output data signals from a time point at which said one of the circuits that exist in the actual output path has outputted the reference clock signals.

42. The semiconductor memory device as claimed in claim 39, wherein the internal clock signals include first and second clock signals, which are complementary to each other, the output control signals include first and second output control signals, and said one of the circuits that exist in the actual output path comprises, in order to further generate the reference clock signals:
a first logic circuit for outputting first logic signals in response to the first clock signals, the first logic circuit including multiple inverters connected in series; and
a second logic circuit for outputting the reference clock signals in response to the first logic signals.

* * * * *